United States Patent [19]
Newman

[11] Patent Number: 5,237,205
[45] Date of Patent: * Aug. 17, 1993

[54] GROUND PLANE FOR PLASTIC ENCAPSULATED INTEGRATED CIRCUIT DIE PACKAGES

[75] Inventor: Robert A. Newman, Santa Clara, Calif.

[73] Assignee: Advanced Micro Devices, Inc., Sunnyvale, Calif.

[*] Notice: The portion of the term of this patent subsequent to Nov. 26, 2008 has been disclaimed.

[21] Appl. No.: 710,416

[22] Filed: Jun. 5, 1991

Related U.S. Application Data

[62] Division of Ser. No. 415,844, Oct. 2, 1989, Pat. No. 5,068,708.

[51] Int. Cl.$^5$ .................. H01L 23/48; H01L 29/46
[52] U.S. Cl. .................. 257/783; 257/668; 257/676; 361/765; 361/771
[58] Field of Search ............ 357/68, 70, 71, 74, 357/72; 257/783, 676, 668, 747, 787; 361/400, 402, 407, 421

[56] References Cited

U.S. PATENT DOCUMENTS

| | | | |
|---|---|---|---|
| 4,147,889 | 4/1979 | Andrews et al. | 357/80 |
| 4,410,927 | 10/1983 | Butt | 357/81 |
| 4,446,477 | 5/1984 | Currie et al. | 357/74 |
| 4,480,262 | 10/1984 | Butt | 357/74 |
| 4,680,613 | 7/1987 | Daniels et al. | 357/72 |
| 4,783,428 | 11/1988 | Kalfus | 437/209 |
| 4,870,474 | 9/1989 | Karashina | 357/70 |
| 5,068,708 | 11/1991 | Newman | 357/68 |

FOREIGN PATENT DOCUMENTS 0207645 3/1985 Japan .

OTHER PUBLICATIONS

*MM Multi-Layer Molded High performance PQFP*, published by Intel containing the three following disclosures: Seth et al., "Plastic Quad Float Pack", 1989 Japan International Electronic Manufacturing Technology Symposium, Apr. 27, 1989, pp. 1-1 to 1-7.

Mallik, et al., "Multi-Layer Molded Plastic Package", 1989 Japan International Electronic Manufacturing Technology Symposium, Apr. 27, 1989, pp. 2-1 to 2-9.

Mallik, et al., "High Performance PQFP", 39th Electronic Components Conference, May 24, 1989, pp. 3-1 to 3-9.

"Modified Polyimide for Low End Packaging", *Research Disclosure*, Jan., 1987, p. 32.

*Primary Examiner*—Rolf Hille
*Assistant Examiner*—David Ostrowski
*Attorney, Agent, or Firm*—John P. Taylor

[57] ABSTRACT

A plastic encapsulated integrated circuit package is disclosed which comprises a multilayer ground plane assembly bonded to a lead frame with an integrated circuit die bonded to the composite assembly. The multilayer ground plane assembly is first formed by bonding together a copper sheet and a thermally conductive polyimide material insulating layer to which is also bonded a layer of a b-stage epoxy resin. The ground plane assembly is then bonded to the lead frame by placing the b-stage epoxy layer of the ground plane assembly against the lead frame and heating the ground plane assembly and lead frame to a temperature of from about 120° C. to just under 200° C. for a time period not exceeding about 10 seconds to bond the b-stage epoxy resin to the lead frame without oxidizing it. An integrated circuit die is then attached to the composite assembly with an epoxy adhesive and the die attached assembly is then cured in a nonoxidizing atmosphere in an oven at approximately 150° C. for about 90 minutes to cure the adhesive and the b-stage epoxy layer. The die is then electrically connected to the lead frame. The bonded together ground plane/lead frame/die composite assembly is then placed in a mold and encapsulated in plastic.

16 Claims, 4 Drawing Sheets

GROUND PLANE FOR PLASTIC ENCAPSULATED INTEGRATED CIRCUIT DIE PACKAGES

This is a divisional of copending application Ser. No. 07/415,844 filed on Oct. 2, 1989, now issued as U.S. Pat. No. 5,068,708 on Nov. 26, 1991.

BACKGROUND OF THE INVENTION

1. Field of the Invention

This invention relates to plastic encapsulated integrated circuit die packages. More particularly, this invention relates to formation of an improved ground plane for an integrated circuit package which is capable of also providing heat dissipation and mechanical support for the package as it is being formed.

2. Description of the Related Art

In the packaging of integrated circuit structures, it is known to provide metal portions adjacent the integrated circuit die which electrically function as ground planes to reduce inductance, and thereby speed the performance of the device, as well as to provide a heat sink or dissipation means.

For example, Andrews U.S. Pat. No. 4,147,889 discloses a chip carrier comprising a printed circuit board having a metal layer formed on each surface. The metal layer on one surface comprises an external heat sink of substantial surface area while the metal layer on the side to which the chip is bonded is patterned to form lead fingers and a central metal heat sink to which the chip is bonded. According to the patentees, holes may be provided through the printed circuit board which are subsequently filled with metal to provide a direct metal contact between the heat sink to which the chip is bonded and the external heat sink.

Butt U.S. Pat. No. 4,410,927 teaches a casing for an electrical component such as an integrated circuit die with a metal base member onto which the die is bonded using an epoxy adhesive. A lead frame is also sealed and bonded to the metal base member. A metal housing member is mounted upon the base member to form an enclosed casing.

Daniels et al U.S. Pat. No. 4,680,613 discloses a low impedance package for an integrated circuit die comprising a lead frame without a central paddle and a ground plate which forms the die attach plane and which is spaced from and parallel to the lead frame. A dielectric layer is formed between the lead frame and the ground plate.

Katagiri Japanese Patent document 59-207645 discloses a semiconductor device and lead frame wherein a heat dissipating plate is connected to a semiconductor chip through a mounting agent which is a good heat conductor. After connecting the chip to leads via wires, the chip and leads are sealed by a resin mold layer so that the surface of the heat dissipating plate is exposed.

Usually, however, it is more difficult to incorporate a metal ground plane/heat sink into a plastic-encapsulated integrated circuit package because of the difficulty of orienting and mechanically assembling together the integrated circuit die, lead frame, and ground plane/heat sink prior to the encapsulation step which will then serve to provide the mechanical bonding together of the components comprising the package.

It would, therefore be desirable to provide a plastic-encapsulated integrated circuit package incorporating therein an electrical ground plane/thermal heat sink and a method of assembling such a structure which will provide a mechanically stable and strong structure prior to encapsulation.

SUMMARY OF THE INVENTION

It is, therefore, an object of this invention to provide a plastic encapsulated integrated circuit structure comprising a multilayer ground plane assembly bonded to a lead frame with an integrated circuit die bonded to the composite assembly.

It is another object of the invention to provide a method for forming a plastic encapsulated integrated circuit structure comprising a ground plane assembly bonded to a lead frame and to an integrated circuit die.

These and other objects of the invention will be apparent from the following description and accompanying drawings.

DETAILED DESCRIPTION OF THE INVENTION

Figure 1:
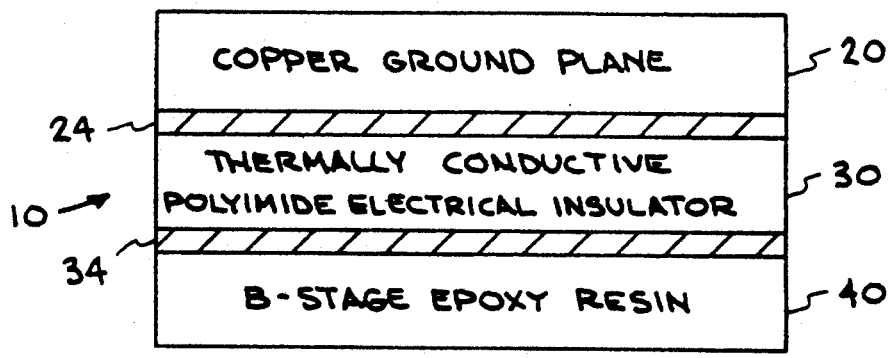
FIG. 1 is a vertical cross-sectional view of the ground plane assembly of the invention.

Referring now to FIG. 1, a ground plane assembly 10 is generally indicated comprising a copper ground plane 20, an insulating layer 30, and a b-stage epoxy layer 40 bonded to one another. The representation of these layers depicted in FIG. 1 will be understood to not be in scale, with the thickness of some of the layers exaggerated for illustrative purposes. Ground plane assembly 10, which will be bonded to a lead frame, as discussed below, is, in accordance with the invention, preassembled together as a unit prior to such bonding to a lead frame.

Copper ground plane 20 in assembly 10 is bonded to electrically insulating film 30 using a high temperature-resistant adhesive 24 such as, for example, CL101, a high temperature epoxy adhesive available from the Chomerics company which is capable of withstanding temperatures as high as 300° C. Bonded to the opposite surface of insulating film 30, using a second layer 34 of the same high temperature-resistant adhesive, is b-stage epoxy layer 40.

Copper ground plane 20 generally comprises copper foil or sheet stock ranging in thickness from about 1.5 to 20 mils. Preferably the thickness will range from about 5 to 10 mils to provide both the desired electrical ground plane as well as providing good heat conductivity.

Insulating layer 30 comprises a material which will electrically insulate copper ground plane 20 from either the lead frame or the integrated circuit die as will be explained below. Insulating layer 30 ranges in thickness from about 1 to about 3 mils, and preferably comprises a polyimide film such as, for example, Kapton. Most preferably, insulating layer 30, while exhibiting electrical insulation properties, will be a heat conductor. Such materials are commercially available, for example, as alumina-filled polyimide films.

For example, it has been found that the structure of the invention provides about 11% better heat conductivity over conventionally formed structures when a conventional polyimide insulating layer is used, but from 15 to 20% improvement in heat conductivity when a heat conducting polyimide insulating film is used.

The b-stage epoxy film layer 40 comprises an epoxy resin which has been partially cured or cross linked to a degree where it resembles cheese in that it is a non-sticky solid which is still flexible and capable of further curing, as well as adherence to other materials upon application of heat to assembly 10. The thickness of epoxy layer 40 generally ranges from about 1 to about 3 mils. Examples of commercially available b-stage epoxy resins which may be used in the practice of the invention include Amicon C990 epoxy resin (w/o silver flake filler) available from Emerson and Cuming, Inc., a division of W. R. Grace and Company.

Figure 2:
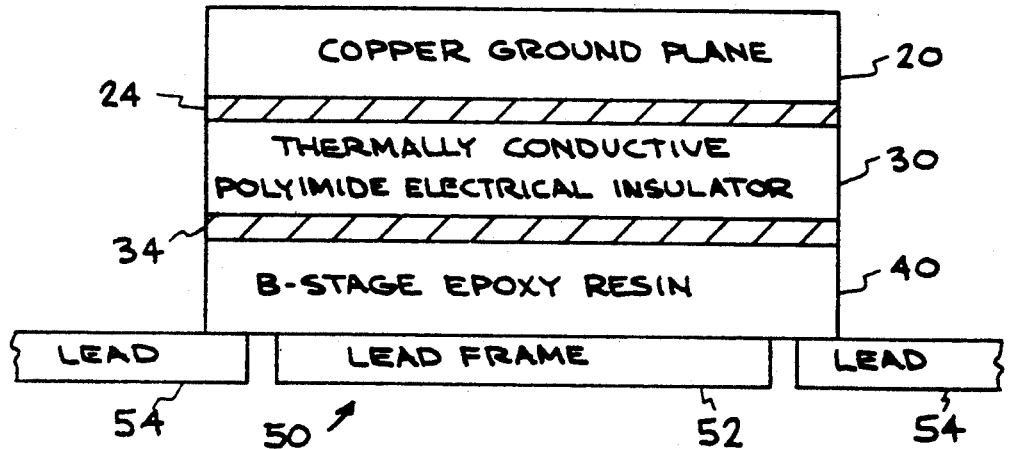
FIG. 2 is a fragmentary vertical cross-sectional view showing the ground plane assembly of the invention to a lead frame.
Figure 3:
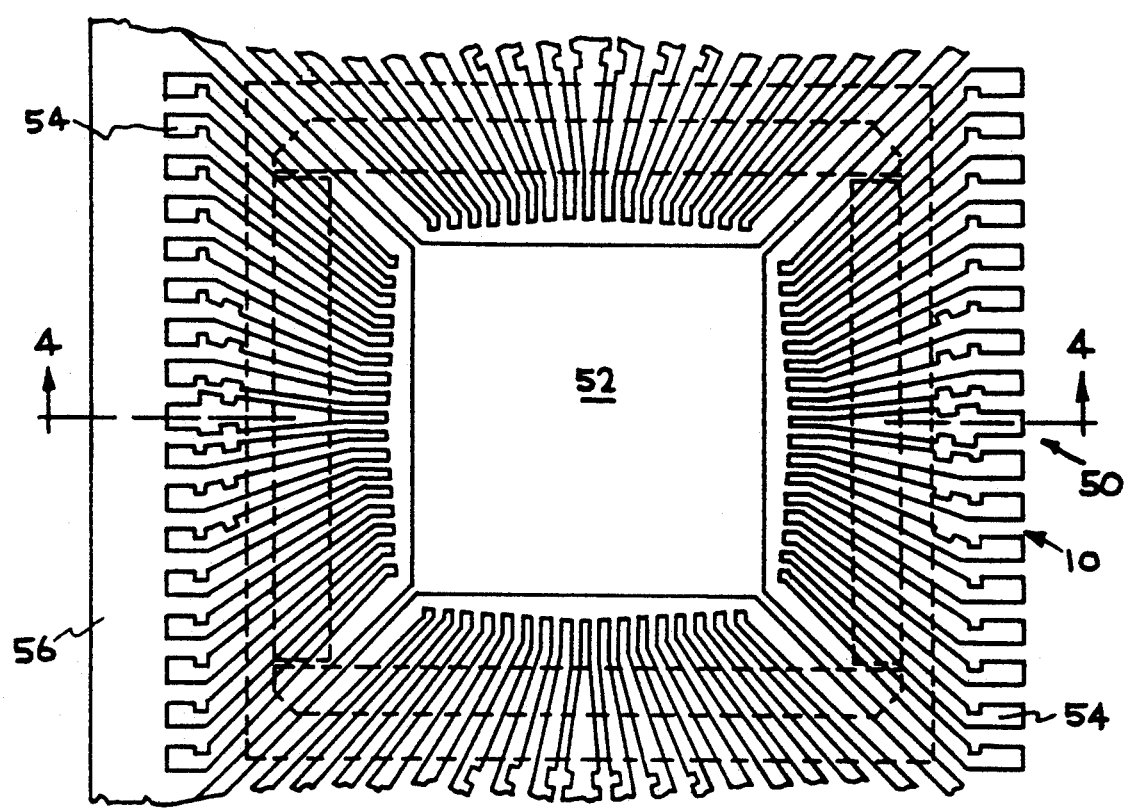
FIG. 3 is a top view of the lead frame shown in FIG. 3 with the outline of the ground plane assembly bonded thereto shown in dotted lines to permit view of the lead frame thereunder.

Referring now to FIGS. 2 and 3, ground plane assembly 10 is now bonded to a conventional metal lead frame 50 which, in the embodiment shown in FIGS. 2-5, is provided with a center die paddle 52 and lead fingers 54 which radiate out on all four sides of lead frame 50, as can best be seen in FIG. 3.

As also seen in FIG. 3, the length and width of ground plane assembly 10, i.e., the area of assembly 10 in contact with lead frame 50, is larger than the length and width of center die paddle 52 so that ground plane assembly 10 is in contact with, and bonded to, the inner ends of lead frame leads 54 to thereby impart mechanical strength to the bonded together lead frame/ground plane composite assembly after the outer portions 56 of lead frame 50 are severed, as is commonly practiced in the art, to thereby electrically isolate the individual leads 54 from one another. Normally, such a severing operation is carried out after assembly and connection of the integrated circuit die to the lead frame and the encapsulation of the die and lead frame within a plastic encapsulant which provides the needed mechanical stability to permit severance of lead frame outer lead portions 56 from leads 54.

Ground plane assembly 10 is bonded to lead frame 50 by centrally positioning ground plane assembly 10 over lead frame 50 with the exposed surface of b-stage epoxy layer 40 resting on lead frame 50. Ground plane assembly 10 and lead frame 50 are then heated to a temperature of from about 120° C. to just below 200° C. for about 2 to about 10 seconds, preferably about 5 seconds, to soften and melt b-stage epoxy layer 40 sufficiently to cause lead frame 50 to bond to ground plane assembly 10 via b-stage epoxy layer 40. By a temperature of "just below 200° C." is meant a temperature of about 199° C.

It should be noted that it is important to the practice of this invention that the lead frame 50/ground plane assembly 10 sandwich or composite assembly not be heated (in an oxidizing atmosphere) for a temperature/time period sufficient to oxidize the metal lead frame which is conventionally formed using copper and which is capable of rapidly oxidizing, i.e., within 15-20 seconds at temperatures exceeding 200° C.

It is not necessary to complete the curing of the b-stage epoxy resin at this time since the die 100 is first bonded either to central die frame paddle 52 of metal lead frame 50 or, if there is no central die frame paddle, directly to b-stage layer 40 using an epoxy adhesive made from the same epoxy resin and then all of the epoxy materials can be cured at the same time.

Figure 4:
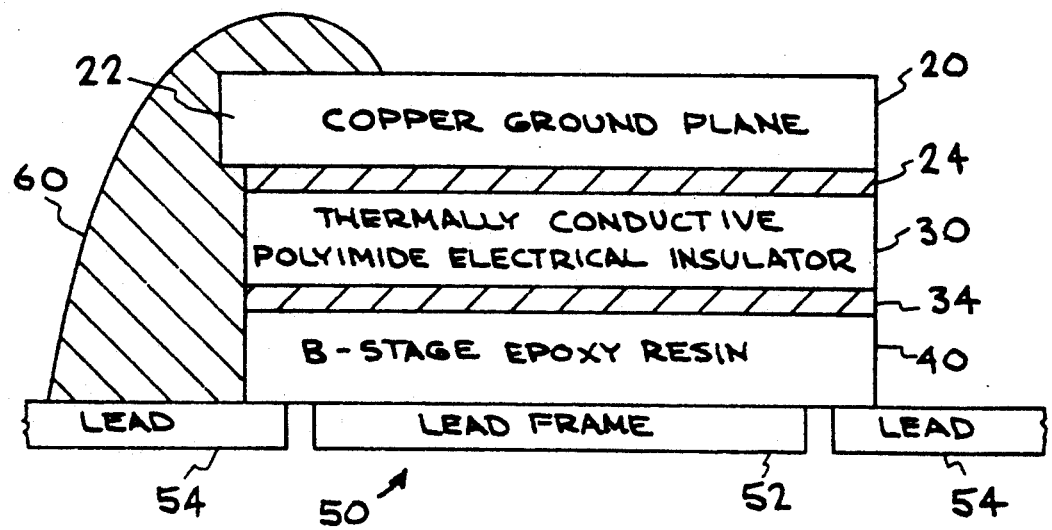
FIG. 4 is a fragmentary vertical cross-sectional view taken along lines 4—4 of the structure of FIG. 3 showing the bonding of the ground plane to a lead on the lead frame.

After ground plane assembly 10 and lead frame 50 have been bonded together, one or more leads 54 may be electrically and thermally bonded to copper ground plane layer 20, as shown in FIG. 4, using an electrically conductive epoxy material 60 which may comprise a silver-filled epoxy material having sufficient metal filler to render the epoxy resin electrically conductive as well as thermally conductive. If desired, copper ground plane layer 20 may be provided with one or more tabs 22, as shown in FIG. 4, to facilitate such bonding to leads 54 on lead frame 50. These tabs may be electrically connected to leads 54 by, for example, spot welding.

Figure 5:
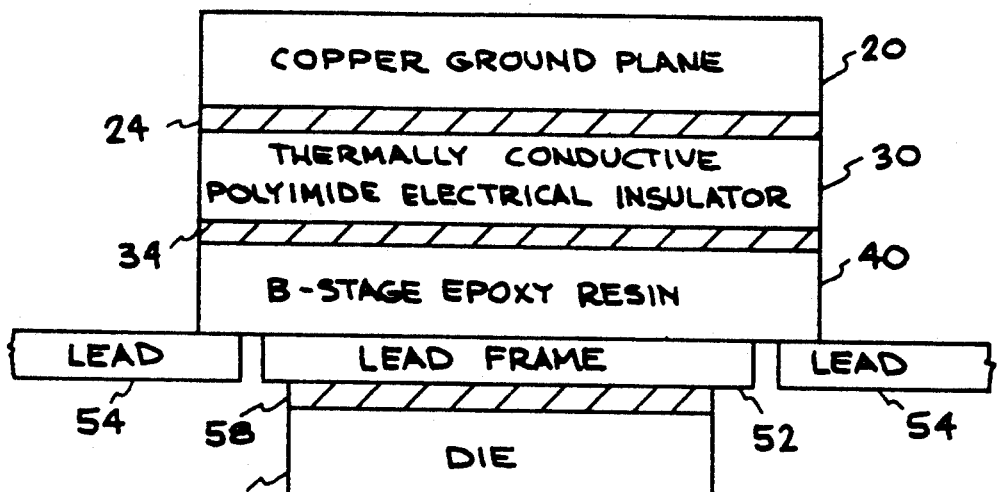
FIG. 5 is a fragmentary vertical cross-sectional view of the ground plane assembly of the invention bonded to a lead frame with an integrated circuit die bonded to the composite assembly.

As shown in FIG. 5, an integrated circuit die 100 may now be physically bonded to die frame paddle 52 of the bonded composite assembly at 58 using, for example, an epoxy resin similar to that used in forming b-stage epoxy layer 40, except that the epoxy adhesive used here is preferably an electrically conductive epoxy, e.g., an epoxy filled with silver flake such as Amicon C990 conductive epoxy resin. Use of such an electrically conductive epoxy here provides a floating potential which is capacitively coupled to copper ground plane layer 20.

The b-stage epoxy layer 40 and the conductive epoxy resin used as the adhesive to bond the integrated circuit die to die paddle 52 of lead frame 50 may now be cured by heating the structure in a nitrogen or other non-oxidizing atmosphere to a temperature of from about 120° C. up to not exceeding just under 200° C and maintaining the structure at this temperature for from about 30 to about 200 minutes, preferably from about 30 to about 120 minutes, usually about 90 minutes, to fully cure the epoxy resins.

Figure 9:
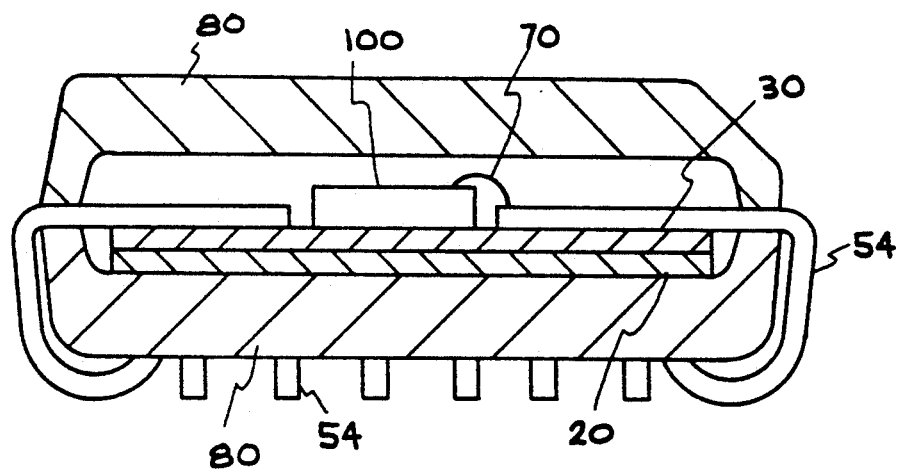
FIG. 9 is a vertical cross-section view of a plastic encapsulated integrated circuit structure formed in accordance with the invention.

After physical attachment of die 100 to lead paddle 52 of lead frame 50, the inner ends of leads 54 may then be conventionally attached (electrically connected) to the appropriate die pads on die 100 using bond wires 70 (FIG. 9). This is usually accomplished with an automatic wire bonder such as, for example, a K&S 1482 gold wire bonder, available from Kulicke and Soffa Industries, Inc.

Figure 7:
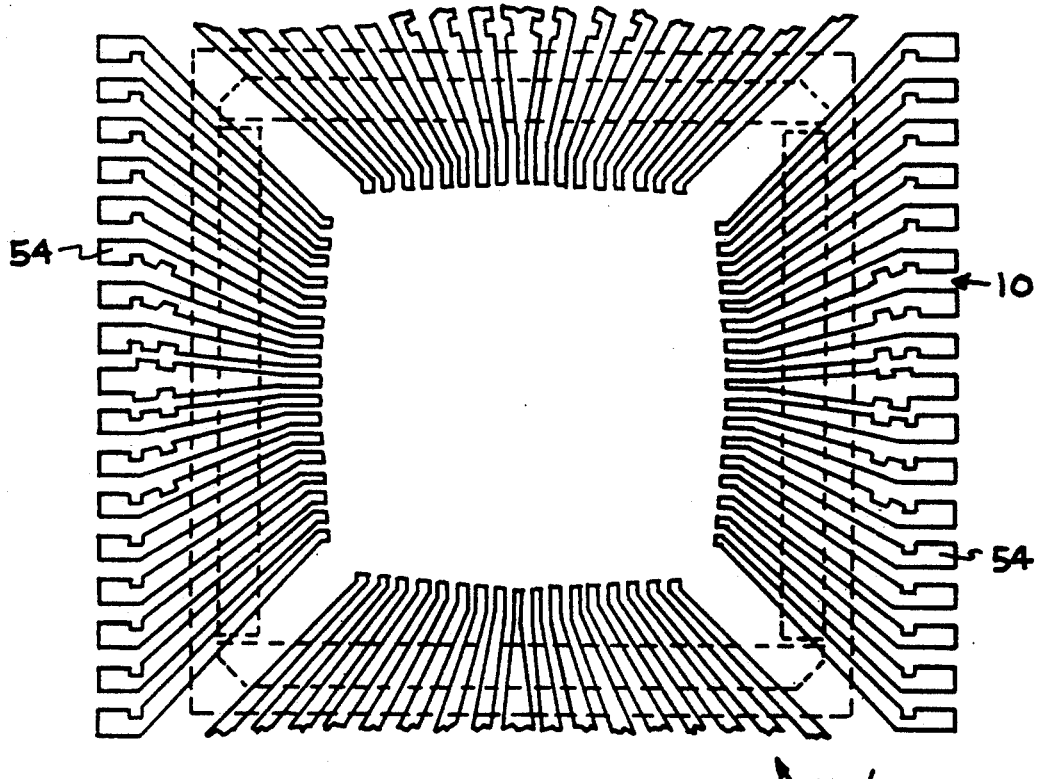
FIG. 7 is a top view of the lead frame shown in FIG. 6 with the outline of the ground plane assembly bonded thereto shown in dotted lines to permit view of the lead frame thereunder.
Figure 6:
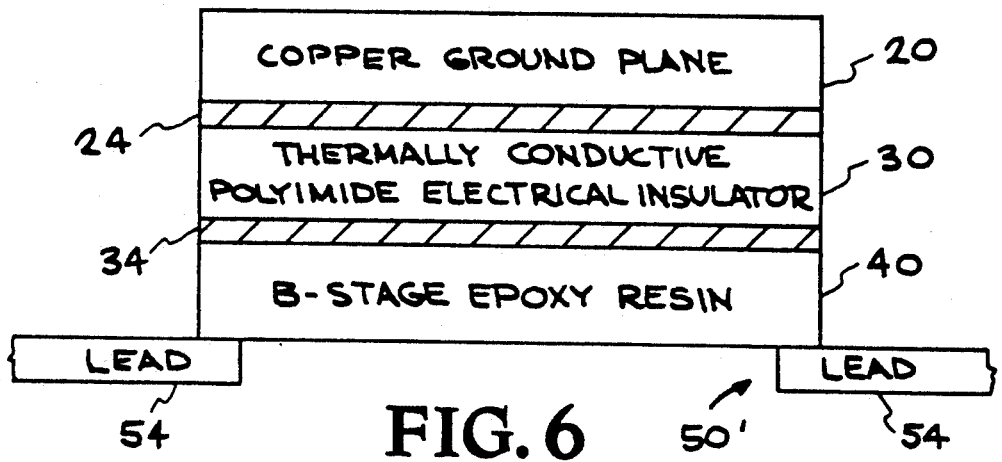
FIG. 6 is a fragmentary vertical cross-sectional view of another embodiment of the invention showing the ground plane assembly of the invention bonded solely to the leads of a lead frame formed without a center die paddle.
Figure 8:
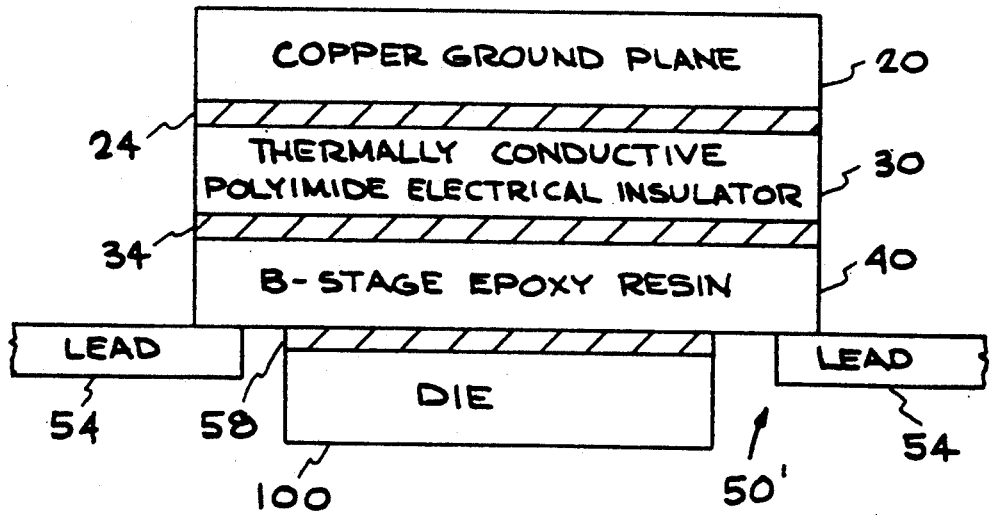
FIG. 8 is a fragmentary vertical cross-sectional view of the ground plane assembly of the invention bonded to a lead frame as in FIGS. 6 and 7, but with an integrated circuit die bonded directly to the ground plane assembly.

Turning now to FIGS. 6–8, another embodiment of the invention is illustrated wherein lead frame 50', as best seen in FIG. 7, does not have a central die paddle 52. Ground plane assembly 10 is, therefore, bonded to lead frame 50' solely by bonding b-stage epoxy layer 40 directly to lead frame fingers 54.

In this embodiment, integrated circuit die 100 is then bonded directly to b-stage epoxy layer 40, as shown in FIG. 8, preferably using, as an adhesive, an epoxy material which is at least chemically and mechanically compatible with the epoxy material in epoxy layer 40 of ground plane assembly 10. Most preferably, the epoxy adhesive comprises the same epoxy resin material as that used in epoxy layer 40 but in uncured form.

FIG. 9 illustrates a cross-section of the final product of the embodiment of FIGS. 6–8 with the bonded together ground plane assembly/lead frame/die encapsulated in an epoxy novalac plastic encapsulating material 80 such as Sumitomo 6300H. In the cross-section shown in FIG. 9, b-stage epoxy layer layer 40 and adhesive layers 24 and 34 have been omitted due to their small thickness relative to the thickness of the other portions of the structure. While FIG. 9 shows the embodiment of FIGS. 6–8 in final form, it will be appreciated that FIG. 9 also typifies the final form of the embodiment of FIGS. 2–5 except for the omission of the central die paddle on which die 100 is mounted in the first embodiment.

The integrated circuit structure of the invention, as typified by the structure of FIG. 9, was tested for heat dissipation in comparison to a conventionally formed plastic-encapsulated integrated circuit structure. The prior art structure was found to have a 32.7° C. average temperature rise per watt of power, when operated at a 2 watt level. The plastic-encapsulated integrated circuit structure of the invention, in contrast, had a 29.1° C. rise in temperature per watt at the same power level.

Furthermore, logic-type plastic-encapsulated integrated circuit structures constructed in accordance with the invention, such as an 80286 die, were found to operate at faster speeds due to the lower inductance due to the presence of copper ground plane layer 20. For example a control run of conventionally constructed plastic encapsulated chips with no ground plane yield only 8% 16 mHz chips, while a run constructed in accordance with the invention yielded 31% 16 mHz chips.

Figure 10:
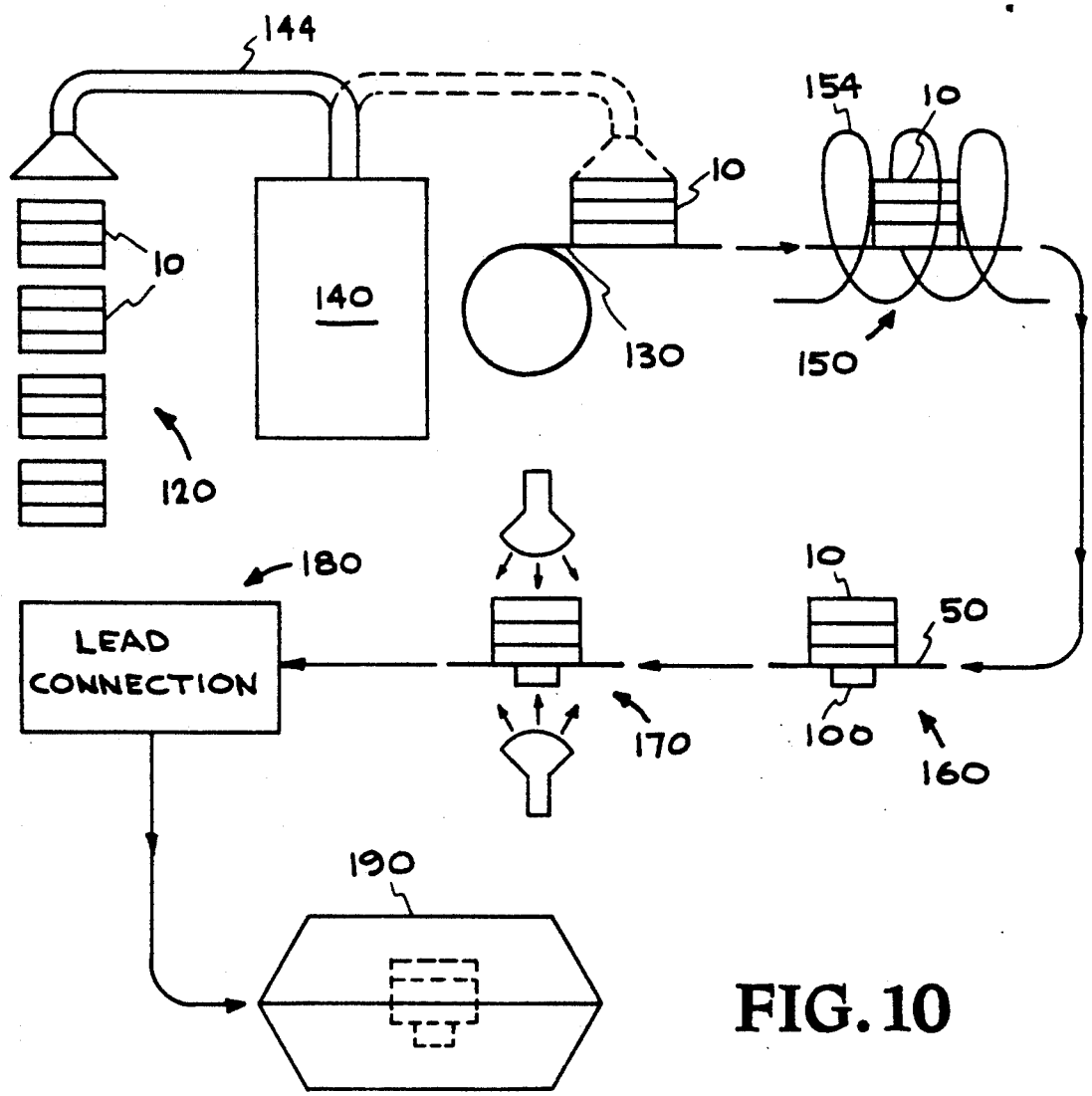
FIG. 10 is a diagrammatical view representative of an automated process which could be utilized for forming the integrated circuit structure of the invention.

In either embodiment, the preassembly or formation of ground plane assembly 10 as a unit lends itself to automation of the packaging process. FIG. 10 is representative to an automated process which could be used in formation of a die package using the preassembled ground plane assemblies 10 of the invention.

In FIG. 10, a magazine or stack 120 of already prepared ground plane assemblies, with the copper side up, may be provided adjacent a movable belt 130 containing lead frames 50 or 50'. A robot mechanism 140 having a vacuum pickup arm 144 thereon may be moved to pick up the top most ground plane assembly 10 and centrally place it on a lead frame 50 or 50'.

The lead frame 50 or 50', with ground plane assembly 10 thereon, then may be passed through a heating station 150, e.g., through an inductance coil 154, which heats ground plane assembly 10 sufficiently to cause b-stage epoxy layer 40 thereon to bond to lead frame 50 or 50'.

The composite assembly of ground plane assembly 10 and lead frame 50 may now be passed to a die attach assembly station 160 wherein integrated circuit die 100 is physically bonded to the composite assembly, preferably using a conductive epoxy adhesive. The assembly then may be passed to a curing station 170 where b-stage epoxy layer 40 and the conductive epoxy resin are cured in a nonoxidizing atmosphere, such as nitrogen or argon, at a temperature of from about 120° C. to not exceeding just under 200° C for a period of from about 30 to about 200 minutes. The leads on the lead frame are then electrically bonded to die pads on die 100 in a lead connection station 180.

The physically and electrically bonded together ground plane assembly/lead frame/die may then be placed in an encapsulation mold 190 and a plastic encapsulant injected into mold 190 to encapsulate the ground plane assembly/lead frame/die, resulting in the product depicted in FIG. 9.

Thus, the invention provides an improved plastic encapsulated integrated circuit package and method of making same wherein a preassembled ground plane subassembly may be bonded to a lead frame and an integrated circuit die bonded to the composite assembly and electrically connected to the lead frame leads prior to encapsulation in plastic whereby the ground plane/lead frame/die assembly is a mechanically strong assembly which may be placed in the plastic encapsulation mold without the need for external means to retain the assembly together prior to encapsulation.

Having thus described the invention, what is claimed is:

1. A multilayer ground plane assembly capable of bonding to a lead frame and an integrated circuit die to form a composite assembly which may be encapsulated in plastic to form a plastic encapsulated integrated circuit package comprising:
    a) a 1.5 to 20 mil copper metal ground plane layer;
    b) a polyimide insulating layer bonded to said copper metal ground plane layer with a high temperature-resistant adhesive capable of withstanding temperatures as high as 300° C.; and
    c) a b-stage epoxy layer bonded to an opposite surface of said insulating layer using said high temperature-resistant adhesive to thereby permit said ground plane assembly to be subsequently heated to bond said b-stage layer to a metal lead frame.

2. The multilayer ground plane assembly of claim 1 wherein said polyimide insulating layer comprises a thermally conductive polyimide material.

3. The multilayer ground plane assembly of claim 1 wherein said b-stage epoxy layer of said assembly ranges in thickness from about 1 to about 3 mils.

4. The multilayer ground plane assembly of claim 1 wherein said b-stage epoxy layer of said assembly is capable of being bonded to said lead frame by heating said assembly and said lead frame to a temperature of from about 120° C. to just under 200° C. for a time period not exceeding about 10 seconds.

5. The multilayer ground plane assembly of claim 1 wherein said copper ground plane member is provided with one or more tabs to permit said copper ground plane member to be electrically connected to one or more leads on said lead frame.

6. The multilayer ground plane assembly of claim 5 wherein said tabs on said copper ground plane member are capable of being welded to leads on said lead frame.

7. The multilayer ground plane assembly of claim 1 wherein said copper ground plane member is capable of being electrically and thermally connected to one or more leads on said lead frame.

8. The multilayer ground plane assembly of claim 7 wherein said copper ground plane member is further capable of being electrically and thermally connected to said one or more leads on said lead frame using an electrically conductive epoxy material.

9. A multilayer ground plane assembly capable of bonding to a lead frame and an integrated circuit die to form a composite assembly which may be encapsulated in plastic to form a plastic encapsulated integrated circuit package comprising:
  a) a 1.5 to 20 mil copper metal ground plane layer provided with one or more tabs to permit said copper ground plane member to be electrically connected to one or more leads on a lead frame;
  b) a polyimide insulating layer bonded to said copper metal ground plane layer with a high temperature-resistant adhesive capable of withstanding temperatures as high as 300° C.; and
  c) a 1–3 mil b-stage epoxy layer bonded to an opposite surface of said insulating layer using said high temperature-resistant adhesive to thereby permit said ground plane assembly to be subsequently heated to bond said b-stage layer to said metal lead frame by heating said assembly and said lead frame to a temperature of from about 120° C. to just under 200° C. for a time period not exceeding about 10 seconds.

10. A multilayer ground plane assembly capable of bonding to a lead frame and an integrated circuit die to form a composite assembly which may be encapsulated in plastic to form a plastic encapsulated integrated circuit package comprising:
  a) a 1.5 to 20 mil metal ground plane layer;
  b) an insulating layer bonded to said metal ground plane layer; and
  c) a b-stage epoxy layer bonded to an opposite surface of said insulating layer whereby said ground plane assembly may be subsequently heated to bond said b-stage layer to a metal lead frame.

11. A multilayer ground plane assembly capable of bonding to a lead frame and an integrated circuit die to form a composite assembly which may be encapsulated in plastic to form a plastic encapsulated integrated circuit package comprising
  a) a 1.5 to 20 mil copper metal ground plane layer;
  b) an insulating layer bonded to said copper metal ground plane layer; and
  c) a b-stage epoxy layer bonded to an opposite surface of said insulating layer to thereby permit said ground plane assembly to be subsequently heated to bond said b-stage layer to a metal lead frame.

12. The multilayer ground plane assembly of claim 11 wherein said insulating layer comprises a polyimide insulating layer.

13. A multilayer ground plane assembly suitable for use in forming a plastic encapsulated integrated circuit package comprising:
  a) a copper metal ground plane layer; p1 b) a b-stage epoxy layer; and
  c) an insulating layer bonded to said copper metal ground plane layer and to said b-stage epoxy layer using a high temperature-resistant adhesive capable of withstanding temperatures as high as 300° C. to thereby permit said ground plane assembly to be subsequently heated to bond said b-stage layer to a metal lead frame.

14. A multilayer ground plane assembly suitable for use in forming a plastic encapsulated integrated circuit package comprising:
  a) a metal ground plane layer;
  b) an insulating layer bonded to said metal ground plane layer; and
  c) b-stage epoxy layer bonded to said insulating layer, said b-stage epoxy layer ranging in thickness from about 1 to about 3 mils.

15. The multilayer ground plane assembly of claim 14 wherein said metal ground plane layer has a thickness ranging from about 1.5 to about 20 mils.

16. The multilayer ground plane assembly of claim 14 wherein said ground plane member is provided with one or more tabs capable of being electrically connected to one or more leads on a lead frame.

* * * * *